US008234779B2

(12) United States Patent
Larsson

(10) Patent No.: US 8,234,779 B2
(45) Date of Patent: Aug. 7, 2012

(54) ARRANGEMENT AND SYSTEM AT A COMPONENT MOUNTING MACHINE

(75) Inventor: Andreas Larsson, Goeteborg (SE)

(73) Assignee: Mydata Automation AB, Bromma (SE)

( * ) Notice: Subject to any disclaimer, the term of this patent is extended or adjusted under 35 U.S.C. 154(b) by 437 days.

(21) Appl. No.: 12/594,166

(22) PCT Filed: Mar. 28, 2008

(86) PCT No.: PCT/SE2008/050365
§ 371 (c)(1),
(2), (4) Date: Sep. 30, 2009

(87) PCT Pub. No.: WO2008/121068
PCT Pub. Date: Oct. 9, 2008

(65) Prior Publication Data
US 2010/0058579 A1 Mar. 11, 2010

(30) Foreign Application Priority Data
Mar. 30, 2007 (EP) .................................. 07105388

(51) Int. Cl.
*B23P 19/00* (2006.01)
(52) U.S. Cl. ................ 29/760; 29/739; 29/740; 29/809; 414/222.01; 414/331.01
(58) Field of Classification Search .................... 29/760, 29/739, 740, 809, 833, 840; 414/222.01, 414/223.01, 331.01, 401, 584
See application file for complete search history.

(56) References Cited

U.S. PATENT DOCUMENTS

| 4,934,891 | A | * | 6/1990 | Hawkswell | 414/223.01 |
| 5,084,962 | A | * | 2/1992 | Takahashi et al. | 29/833 |
| 2002/0067980 | A1 | | 6/2002 | Havich et al. | |
| 2003/0152448 | A1 | | 8/2003 | Lee | |

FOREIGN PATENT DOCUMENTS

| EP | 0 326 236 A2 | 8/1989 |
| JP | 08-125385 A | 5/1996 |
| JP | 10-022688 A | 1/1998 |
| JP | 10-041688 A | 2/1998 |
| JP | 2005-347351 A | 12/2005 |

* cited by examiner

*Primary Examiner* — Thiem Phan
(74) *Attorney, Agent, or Firm* — Birch, Stewart, Kolasch & Birch, LLP

(57) ABSTRACT

A component tube holding arrangement for holding one or more component tubes and for vibratory feeding of components in a picking position in a component mounting machine, as well as a combination of such a component tube holding arrangement and a vibratory feed magazine. The arrangement comprises a support surface for supporting component tubes, a reception portion for receiving component tubes, and at least one component stop at the reception portion defining a picking position for fed components. The arrangement also comprises identification means holding information of the identity of the arrangement. The arrangement is further arranged to be releasably mountable in a component mounting machine or in a vibratory feed magazine arranged to be loaded into the component mounting machine. The component tube holding arrangement lacks component feeding means and is arranged for allowing vibratory feeding means provided in the magazine.

20 Claims, 12 Drawing Sheets

ARRANGEMENT AND SYSTEM AT A COMPONENT MOUNTING MACHINE

TECHNICAL FIELD OF THE INVENTION

The present invention generally relates to the field of manufacture and assembly of circuit boards. More specifically, the invention relates to a component tube holding arrangement for holding one or more elongated component tubes and for vibratory feeding of components in a feeding direction towards a picking position in a component mounting machine, and a system including such an arrangement and a vibratory feed magazine.

BACKGROUND OF THE INVENTION

Generally, within the field of manufacture and assembly of circuit boards, electronic components are fed to a component mounting machine for mounting the components onto a circuit board. The components can be provided in various ways, such as in component tapes, bulk containers or component tubes. In the latter, components are consecutively stored in elongated, generally plastic tubes. The tubes are generally arranged with open ends that are plugged during shipping and storage. In operation, at least one of the plugs are removed, and the component tube is inserted with the open end first into a component mounting machine, or more commonly into a magazine for use in a component mounting machine. Such a magazine is provided with vibratory feeding means, which brings about a motion of the component tube resulting in a feeding of the components contained therein, out of the open end thereof towards a picking position in the mounting machine. The picking position is determined, in the feeding direction of the components, by the size of the component and by a component stop arranged in a component receiver or positioner which is provided near the open end of the component tube and which restricts the further forward feed of the component. Thus, the dimensions and position of the component receiver determine the longitudinal, i.e. in the feeding direction, picking position for the component to be picked.

In the simplest case, the so called vibratory feeding means could simply provide a vibration which, sometimes in combination with a tilting of the component tube, results in components practically being shaken out of the tubes towards the picking position. However, the so called vibratory movement is generally a very quick reciprocating movement feeding the components forward within and out of the tubes. In theory, the components and the component tubes are brought forward together during the forward moving portion of the reciprocating movement, but only the component tube is brought back during the backward moving portion of the reciprocating movement. In practice, the components experience a backward movement as well, but the component tube is brought back more than the components during the backward portion of the feeding movement, thereby producing the forward feed of the components. Since the movement can be so fast and the length of stroke so short, the reciprocating movement is often not discernable to a human eye, and such feeding is therefore generally referred to as vibration or vibratory feeding, whether it is a carefully controlled reciprocal movement or a lesser controlled vibration.

Prior to the vibratory feeding of components towards the picking position in a component mounting machine, a plurality of component tubes, holding components to be used in the ensuing mounting process, are loaded into a component magazine, which generally is provided with vibratory feeding means. Component mounting machines require that a component that is to be picked is positioned at a well defined picking position, known or identifiable by the mounting machine software. Thus, following loading of the component tubes in prior art component mounting machines, the position for picking the components being fed out of the tubes is determined.

Generally, the picking positions for components from a plurality of laterally adjacent component tubes are preferably located along an essentially straight line. This is particularly important for a split-axis machine where the pick-up head is arranged for general movement in one direction during picking and placing, generally the lateral or X direction, while the positioning in the direction perpendicular thereto, generally the longitudinal or Y direction, during placement is provided by moving the circuit board. However, it is also applicable to a mounting machine in which the pick-up head moves in both the X and Y directions during picking and placing. Since the components are often of different sizes and are preferably picked at the longitudinal and lateral centre of the component body, the picking positions in the feeding directions are adjusted by varying the positions of the component stops, such that an alignment essentially along said straight line is obtained. In practice, the position of the component receiver may be adjustable, e.g. by means of a fastening screw which extends through a slit of the component receiver into a fixed seat in a magazine. Additionally, the alignment of picking positions is performed by providing a number of different component receivers, having different longitudinal and lateral dimensions, which are mounted to the component magazine, generally by screw mounting. Then, one component receiver is generally provided for each component tube.

After loading the component tubes and mounting the component receivers in and to a magazine and loading the magazine into a component mounting machine, i.e. before mounting can begin, a manual locating operation is performed as follows. A camera or other vision device provided in the component mounting machine generates an image of the area in the vicinity of the picking position. For each component tube, an operator, guided by the image generated by the camera, carefully moves the camera to the correct picking position for the first component fed from a component tube. The operator then indicates the accurate picking position to the machine software, i.e. generally at the longitudinal and lateral centre of the component body. Since the possibility of post-picking adjustment of the pick-up head in order to compensate for a component being out of position at the picking position is limited, it is often desirable to reduce the offset of the picking position, in particular any offset in the Y-direction in a split-axis machine. Therefore, the locating operation performed by the operator often includes a position adjustment of the component receiver as well, in order to align the component to a desired picking position.

As realized from the above, the loading of component tubes to a component mounting machine before feeding and mounting of components can commence is a time-consuming and sometimes complicated process. This process has to be performed every time a new type of component is added to the circuit board manufacturing process, and every time an empty component tube has to be replaced. This negatively affects the overall time efficiency of the manufacturing process and, hence, the overall costs.

SUMMARY OF THE INVENTION

It is therefore an object of the present invention to provide an alternative solution for handling component tubes at a component mounting machine.

This and other objects are achieved according to the present invention by providing a component tube holding arrangement and a system having the features defined in the independent claims. Preferred embodiments are defined in the dependent claims.

For the purpose of clarity, the term longitudinal refers to the feeding direction for feeding of components, whereas the term lateral refers to the direction perpendicular to the feeding direction. Furthermore, the terms distal and proximal refers to the direction opposite to and along the feeding direction of the components, respectively.

It should also be noted that, in the context of this application, the term vibratory or vibrating includes, but is not restricted to, a quick reciprocal or reciprocating movement. Furthermore, the terms reciprocating and reciprocal includes not only a linear, back-and-forth motion, but also a movement along an elliptical or near circular path. Such an elliptical or near circular feeding motion path generally occurs in a vertical plane.

According to a first aspect of the invention, there is provided a component tube holding arrangement for holding one or more elongated component tubes, and for vibratory feeding of components in a feeding direction towards a picking position in a component mounting machine, said component tube(s) containing consecutively stored components and being provided with an open end, respectively, for releasing components from the component tube(s) at the picking position. The arrangement comprises a support surface for supporting the component tube(s), a reception portion for receiving said open end of the component tube(s), and at least one component stop at the reception portion defining a picking position for components fed from said open end. The arrangement also comprises first identification means holding information of the identity of the arrangement, and being arranged for operative connection to identity receiving means in said component mounting machine or in said magazine. Furthermore, the arrangement is arranged to be releasably mountable in the component mounting machine or in a vibratory feed magazine arranged to be loaded into the component mounting machine, and wherein the arrangement lacks component feeding means and is arranged for allowing vibratory feeding means provided in the magazine or in the component mounting machine to engage with the arrangement for feeding the components towards the picking position.

According to a second aspect of the invention, there is provided a system for vibratory feeding of components towards a picking position in a component mounting machine, the components being consecutively stored in elongated component tubes provided with an open end, respectively, for releasing components from the component tube at the picking position. The system comprises a plurality of component tube holding arrangements as mentioned in the preceding paragraph, as well as a vibratory feed magazine comprising vibratory feeding means for providing a vibratory feeding movement, and identity receiving means arranged for operative connection with said first identification means of said arrangements to receive information of the identity of each arrangement, the magazine being arranged to be loaded into the component mounting machine. Furthermore, each of the arrangements is arranged to be releasably mountable in the vibratory magazine, and is arranged for allowing said vibratory feeding means to engage with the mounted arrangement for affecting a vibratory feeding movement of the mounted arrangement for feeding the components towards the picking position.

The feature that the holding arrangement is releasably mountable implies that there is no complicated or time-consuming operation for mounting the holding arrangement to the vibratory feed magazine. Preferably, suitable mounting and engagement between the holding arrangement and a magazine, or mounting machine, comprising the vibratory feeding means is performed by placing the holding arrangement onto a receiving portion of the magazine or mounting machine. Thus, the interface between the magazine/machine and the holding arrangement should provide for quick and ready attachment and detachment of the holding arrangement. One example of such an interface is presented in the co-pending and co-assigned International Patent application No. PCT/SE2008/050350, and incorporated herein in its entirety by reference.

However, it should be noted that other interfaces may also be suitable and are contemplated within the scope of the present invention. For instance, where the interface disclosed in said co-pending application comprises at least one interface point with curved surface contact portions, the invention disclosed in the present application could in embodiments thereof include an interface having all planar or straight surface contact portions. Thus, the present invention is not limited to a certain type of interface between the magazine and holding arrangement, and any suitable interface providing a releasable mountability of the holding arrangement to the magazine may be utilized.

In the following, embodiments comprising holding arrangements adapted to hold a plurality of component tubes will be described. However, embodiments comprising a holding arrangement adapted to hold a single component tube are also anticipated and lie within the scope of the present application. Such a holding arrangement preferably comprises a single component stop, but other embodiments where the holding arrangement comprises a plurality of component stops even for feeding of components from a single component tube are also anticipated.

Thus, the present invention is based on the insight of providing a component tube holding arrangement for holding component tubes and feeding components from the tubes towards a picking position in a component mounting machine, with the ability to be releasably mounted such that the loading and/or unloading of component tubes into and from the holding arrangement can be performed away from the component mounting machine and/or a vibratory feed magazine intended for loading into a component mounting machine.

Moreover, one or more component stops can be provided on the component tube holding arrangement. Thereby, the picking position of the components fed from the component tubes may be determined and/or defined away from the component mounting machine and/or the vibratory feed magazine. Furthermore, since the component stops are provided on the component tube holding arrangement, the stops are subject to the same vibratory or reciprocating feeding movement as the tube holding arrangement and, thus, the component tubes and the components. Thereby, the risk of the fed components bouncing against a separately arranged, i.e. separated from the tube holder, fixed component stop is reduced or eliminated.

Furthermore, the feeding stroke for reciprocating feeding movements can be larger in a tube holding arrangement where a component stop is subjected to the same movement as the tube holding arrangement and component tubes. In fact, a feeding stroke as large as, or even longer than, the longitudinal extension of the fed components may be used without seriously compromising the feeding and picking process. In this context, the term feeding stroke refers to the distance the component tube and tube holding arrangement is moved from their most proximal to their most distal positions during one single feeding cycle of the reciprocating feeding movement. In the alternative, i.e. if a separately arranged fixed component stop is used, a gap may appear between the component stop and a support surface, supporting the component that has left the component tube and is in a position ready to be picked. This situation arises when the tube holding arrangement and component tube are in their most proximal position during the feeding cycle, i.e. farthest from the picking position. As understood by the skilled person, such a gap must be kept small in order not to interfere with the feeding and picking process of the components, in particular considerably smaller than the longitudinal extension of the smallest component held and fed by the tube holding arrangement.

Thus, using the component tube holding arrangement according to the invention, longer feeding strokes may be used for feeding components towards the picking position. Consequently, the number of feeding cycles required for feeding a component to the picking position may be reduced, thereby of course also reducing the time required for feeding a component to its picking position. This speeds up the overall feeding process and increases the time efficiency of the component mounting machine and circuit board manufacturing process.

Furthermore, the provision of a component tube holding arrangement, for feeding components towards a picking position, that lacks component feeding means, i.e. vibratory or reciprocating feeding means, and is releasably mountable to a vibratory feed magazine or a component mounting machine, entails a number of advantages. By separating the feeding means for providing the vibratory feed from the component tube holding arrangement, i.e. the arrangement does not comprise any feeding mechanisms at all, the manufacturing costs for such a holding arrangement can be significantly reduced. In contrast, the prior art vibratory feed magazine contains vibratory or reciprocal feeding mechanisms, a stationary portion for interfacing the component mounting machine, a movable support portion for holding the component tubes in firm engagement with a support surface, as well as suitable interface means between the different portions. This renders the prior art vibratory feed magazines complicated and expensive to manufacture, as well as reasonably heavy to operate.

Furthermore, according to the invention, a component tube holding arrangement may be prepared and loaded with selected component tubes, holding the particular components associated with a specific job or mounting operation to be performed in the component mounting machine, away from the component mounting machine and vibratory feed magazine. In the prior art machines, a vibratory feed magazine is removed from the component mounting machine when running out of components or when setup is to be performed for a different job. The term job refers herein to the identical or similar mounting of a specific set of different components on a series of circuit boards according to a predetermined pattern or scheme.

Thus, in the prior art machines, mounting is interrupted while the vibratory feed magazine is removed from the mounting machine and fitted with new component tubes for the subsequent mounting operations. This, as stated above, may be a time-consuming operation adversely affecting the time-efficiency of the component mounting process. In contrast, the arrangement according to the invention may be pre-fitted with suitable component tubes while the magazine and mounting machine is still in operation. When replacement components are needed, the holding arrangement that has been used for the previous mounting operation is simply removed from the magazine, and replaced with the newly fitted and prepared arrangement holding component tubes and components to be used for the ensuing mounting operation.

Preferably, the picking positions for the components held by the arrangement is also located and/or defined away from the magazine. Then, only the overall position of the tube holding arrangement in relation to the component mounting machine and the pick-up head thereof has to be determined. According to embodiments of the invention, this is performed using one or several fiducial markings provided on the arrangement. Then, the positional relationship between the fiducial marking(s) and the respective picking positions is known by the system, either being in fixed relationship or determined prior to mounting the arrangement into a vibratory feed magazine and/or the component mounting machine. Examples of such fiducial marking(s) and the use thereof is provided in the co-pending and co-assigned International patent application No. PCT/SE2008/050352, which is incorporated herein in entirety by reference.

A further advantage is that a particular setup of components and component tubes for a shorter job, that has not exhausted the loaded amount of components, may be re-used. Thus, the tube holding arrangement may be removed from the magazine or machine, stored in the condition it was removed, and reloaded into the machine when a similar particular job is to be performed at a later stage. Thereby, the set-up time for a type of mounting job that has previously been performed is significantly reduced, which provides for an efficient upstart of a job. This is particularly beneficial when having recurring short job series, which are frequently interrupted by other mounting jobs. A similar approach for a prior art system would greatly increase costs since an entire vibratory feed magazine would be out of use during the stored period, or refitted with the same setup of components in the time consuming manner described above.

For the purposes of this application, it should be noted that the size of the component tube holding arrangement in relation to a vibratory feed magazine may be adapted such that the magazine is arranged to receive one holding arrangement only. Alternatively, the holding arrangement has a reduced extension, in particular lateral extension, in relation to the magazine such that two or more holding arrangements may be simultaneously mounted to a single vibratory feed magazine. Then, the feeding means of the magazine may be a single means arranged to provide the same feeding movement to all carried holding arrangements, or be divided into separate feeding means independently controlled for providing individual feeding motion for the carried holding arrangements, respectively.

The holding arrangement comprises a support surface for supporting the component tubes held by the arrangement. Preferably, this is an upper surface of the holding arrangement. At one end of the arrangement, there is provided a reception portion where components are received from the component tubes and aligned in a picking position by a component receiver or positioner. Such component positioners are preferably releasably mountable in the holding arrangement, such that a positioner of suitable dimension may be positioned in the appropriate position at the reception portion on the holding arrangement.

In exemplifying embodiments, the reception portion of the arrangement is provided with engagement means for mounting engagement with component positioners. The positioners are then preferably provided side-by-side, such that the picking positions may be essentially aligned along a straight line. In one example, the engagement means is in the form of one or more recesses into which engaging portions of positioners may be introduced and mounted. Preferably, the positioners are mounted in snap-in engagement to the reception portion of the holding arrangement. Then, the positioners are provided with protrusions arranged for snap-in engagement with the recess(es) of the holding arrangement. However, other solutions are also contemplated for the purposes of the present application, such as screw-in engagement, or the like.

In some embodiments, one recess is provided for each positioner. Then, a number of pre-selected locations at the reception portion may be provided for the positioners. In these embodiments, the distance between each recess or intended locations may be less than the actual width or lateral size of a positioner. Thereby, more freedom will be provided in the lateral positioning of the positioners in order to accommodate for positioners of different sizes.

In preferred embodiments, a laterally continuous recess is provided at the reception portion, extending essentially over the lateral extension of the reception portion. Thereby, the lateral position of each positioner and, hence, each component tube and picking position, may be continuously adjusted. Such a continuous recess may also be divided into two or more laterally extended recesses, each being arranged to receive a plurality of component positioners.

As realized by the skilled person, other suitable solutions may be provided for establishing the releasable mountability between the positioners and the holding arrangement, snap-in or others. Regarding snap-in solutions, the snap-in engagement between protrusions of the positioners and recesses of the reception portion may be reversed, such that protrusion of the reception portion engage recesses of the positioners. One example of suitable positioners for snap-in engagement with the holding arrangement is provided in the co-pending and co-assigned International Patent application No. PCT/SE2008/050351, filed on even date herewith, which is incorporated herein by reference in its entirety.

In further embodiments, the reception portion comprises positioner mounting guide means, preferably in the form of small indents, notches or ridges interacting with corresponding protrusions or indents, respectively, arranged on the positioners. Thereby, during mounting of the positioners, the operator is guided by these guide means such that the positioners are directed to selected lateral positions which are easily discernable by the system. The distance or pitch between such indents or ridges may, as an example, be less than the width of the smallest appropriate positioner, for providing freedom in the lateral placement or location of the positioners. Also, a pair or more of longitudinally spaced guide indents or ridges may be provided for each positioner, such that the positioner is guided into alignment with the longitudinal direction of feeding the components.

Preferably, the holding arrangement comprises a plurality of component positioners having different sizes, such that an appropriate positioner can be selected in adaptations to the dimensions of a particular component and a particular component tube.

In embodiments of the invention, the support surface of the component tube holding arrangement is arranged in a common lateral plane. In other words, all component tubes are held at the same level laterally, even though the entire support surface in the longitudinal direction need not be arranged at the same level.

In other embodiments of the invention, the support surface is divided into one or more surface portions being at different levels laterally. Thereby, one single component tube holding arrangement can be used for holding component tubes, and feeding components from these tubes, of very different height. Otherwise, different magazines could be provided for accommodating components and component tubes of varying height, which could vary considerably. However, such a solution suffers from the disadvantage that a plurality of magazines has to be provided simultaneously, or the mounting operation has to be separated into two partial mounting operations, one where the components from low component tubes are mounted, and one where the components from high component tubes are mounted. These two partial mounting operations could be performed in separate mounting machines, or subsequently in the same machine with a switch of component magazines therebetween, both of which resulting in an increase of the manufacturing costs for the overall component mounting process.

Furthermore, according to exemplifying embodiments, the tube holding arrangement is provided with identification means readable by an operator or by the component mounting machine, either directly or via a vibratory feed magazine. Such identification means could be realized in a number of ways, as readily realized by the person skilled in the art, for example as an electronic circuit, such as a radio frequency identification (RFID) tag or a memory circuit, holding information of features of the holding arrangement, or a simple bar code which could be read by a bar code reader, e.g. integrated in the component mounting machine or operated by an operator.

The identification means would not have to be limited to one particular identifier. In some embodiments, there could be provided a first identification means which is machine readable by the component mounting machine, either directly or via a vibratory feed magazine, and a second identification means readable by an operator for associating the holding arrangement identity to component tube information.

In exemplifying embodiments, the information could be limited to an identity of the holding arrangement. In further embodiments, the identification means, e.g. in the form of a memory chip, could hold information of various parameters of the holding arrangement, such as size and weight of the arrangement, number of picking positions, type of arrangement, split or integral support surface, etc. However, the identification means preferably only holds information of the identity of the holding arrangement, and other features and parameters of the arrangement are preferably stored in the mounting machine control system and associated with the particular identity of the holding arrangement.

Furthermore, by providing the tube holding arrangement with identification means, the arrangement identity can be associated with information regarding the specific component tubes that are, or are to be, held by the holding arrangement and, thus, loaded into the mounting machine. Hence, the identity of the holding arrangement will be the key to the information that is essential to the component mounting machine, namely the type of components carried by the component tubes. Thus, according to embodiments of the invention, the identity of the holding arrangement may be associated with information regarding each and every component tube that is held by the holding arrangement. As mentioned above, the loading of component tubes to the holding arrangement is performed away from the mounting machine and may be performed at any time before the mounting of the holding arrangement to the component mounting machine, or a vibratory feed magazine for subsequent loading into the machine.

Furthermore, the position of each component tube in the holding arrangement may also be determined and stored prior to loading into the mounting machine. According to exemplifying embodiments, the component tube information comprises information regarding which type of components that is provided in the tube, i.e. characteristics of the components such as dimensions, resistance, manufacturing tolerances, etc. Preferably, the information also contains the number of components provided in the tube, both when the tube is loaded into a holding arrangement for the first time, but also during and following a particular mounting process. Thus, when a holding arrangement is loaded into a component mounting machine, the system may recognize the amount remaining for a particular component and determine whether this amount is sufficient for the ensuing mounting job. There may also be more information regarding the component tubes that can be useful for the component mounting process. Such information could for instance include component tube identity, batch number, intended customer, manufacturer of the component tube or of the component, the width and height of the tube, etc.

As described earlier, the holding arrangement is provided with the ability to be quickly and readily attached and detached into and from the component mounting machine, or a vibratory feed magazine. According to exemplifying embodiments, holding arrangement identification means is automatically connected to interacting means provided in the machine, or in the vibratory feed magazine, for receiving that information. Thus, the identity of the holding arrangement may be automatically transferred to the component mounting machine when the tube holding arrangement has been mounted into the machine, or the magazine. This is preferably performed by providing the tube holding arrangement with identification means in the form of a circuit holding the identity of the tube holding arrangement. Said circuit can for instance be provided with contact surfaces, which automatically are connected to corresponding contact pins coupled to identity reading means in the component mounting machine or in the magazine, whereby the identity of the tube holding arrangement is read by the machine or the magazine. Said connection could also be an optical connection, an RFID connection, or any other suitable connection as realized by the person skilled in the art.

This means that the component mounting machine not only receives information regarding the identity of the holding arrangement that has been mounted into the machine, but also has access to all information associated with the identity of the tube holding arrangement. Furthermore, information regarding the identity of the vibratory feed magazine can be added to the transferred information. This can be performed by any suitable means for transferring information, as realized by the person skilled in the art, and will therefore not be further described.

In further embodiments, information of the position and particulars of each component tube, such as type and number of components, held by the holding arrangement is associated with the identity thereof, such that said information may be transferred to a vibratory feed magazine upon mounting of the holding arrangement to the magazine via the identification means. This information, i.e. the component type for each component tube position and picking position of the holding arrangement magazine, may then be transferred to the component mounting machine when the magazine has been inserted into the machine. Alternatively, the information is relayed directly to the component mounting machine, via a connection provided in the magazine, without actually being read by the magazine.

As understood by the person skilled in the art, the arrangement and system in accordance with the present invention provides for a quicker and easier loading of component tubes in a vibratory feed magazine and, hence, in a component mounting machine. Thereby, the idle time of the magazine and, consequently, the component mounting machine may be significantly reduced. Furthermore, the handling of component tubes as regards storing and re-loading of component tubes is greatly facilitated.

BRIEF DESCRIPTION OF THE DRAWINGS

Further details and aspects of the invention will become apparent from the following detailed description of embodiments of the invention, reference being made to the accompanying drawings, wherein like reference numerals refer to similar parts throughout, in which.

DETAILED DESCRIPTION OF EXEMPLIFYING EMBODIMENTS

Figure 1:
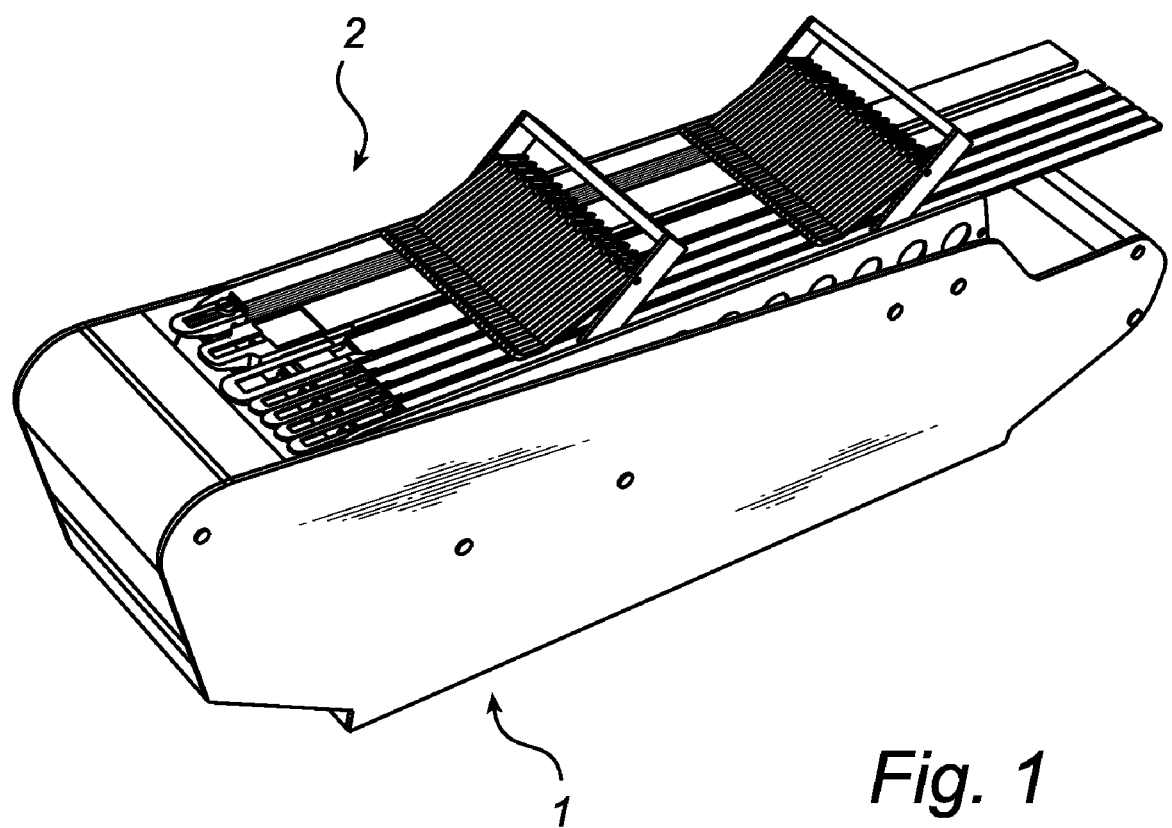
FIG. 1 is a perspective view of an embodiment of a vibratory feed magazine and component tube holding arrangement.
Figure 2:
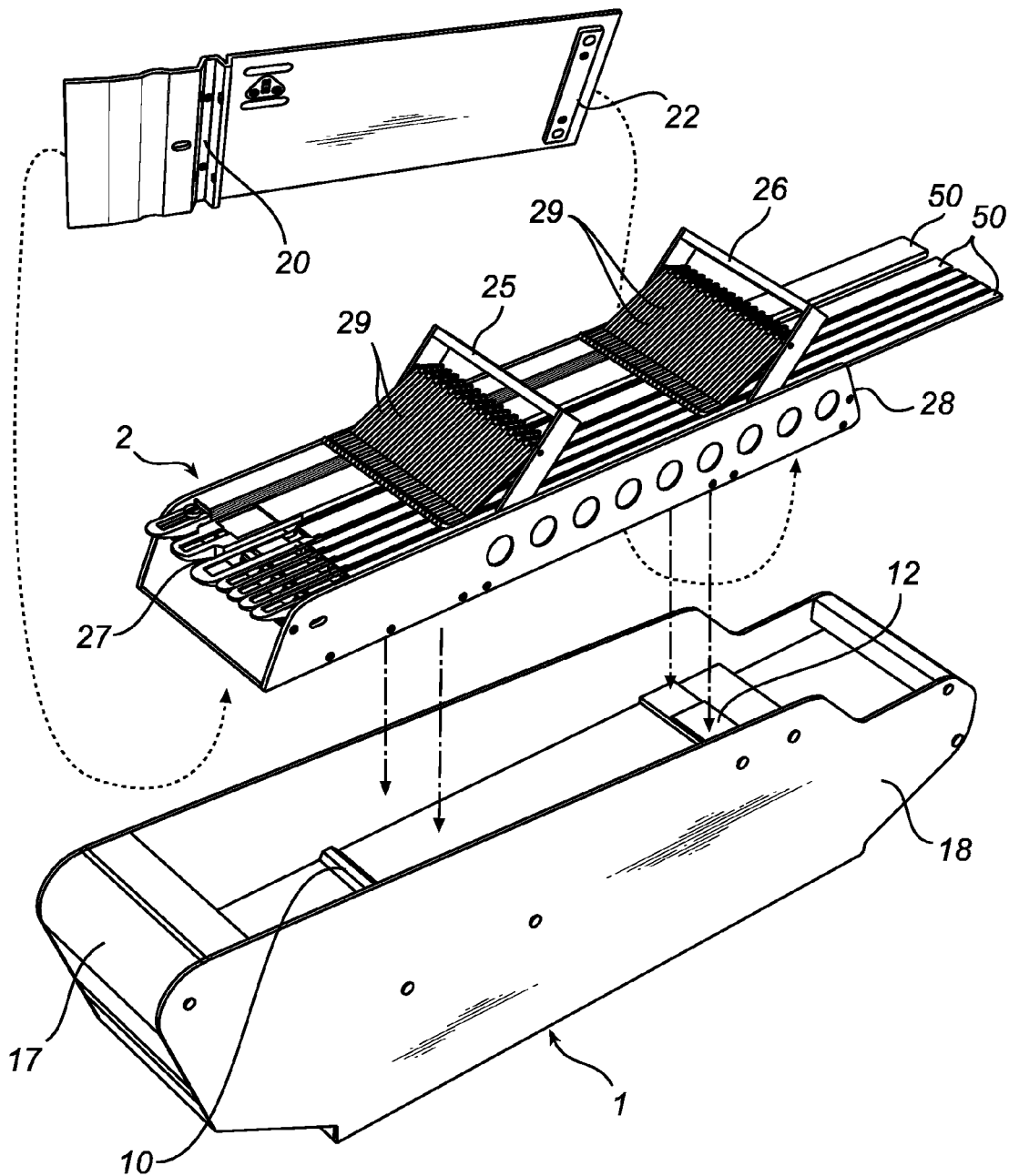
FIG. 2 is a further perspective view of the embodiment shown in FIG. 1 illustrating the releasability of the holding arrangement in relation to the magazine.

The following is a description of exemplifying embodiments in accordance with the present invention. This description is intended for describing the general principles and specific embodiments of the invention and is not to be taken in a limiting sense.

With reference first to FIGS. 1-5, there is shown an embodiment of a vibratory feed component magazine 1 and a component tube holding arrangement 2, arranged for holding a plurality of component tubes 50 containing components, preferably electrical, arranged in sequence in the component tubes 50. In the embodiments to be described below, the holding arrangement has the general shape of a pallet, onto which component tubes 50 are positioned and held. Therefore, the terms "pallet" and "holding arrangement" may in the following be used interchangeably when referring to the illustrated embodiments. Furthermore, when directions and locations are mentioned, the terms front or forward and rear or rearward are related to the feeding direction of the components. Thus, the magazine 1 has a forward end 17 and a rearward end 18, and the holding arrangement or pallet 2 has a forward end 27 and a rearward end 28. Thus, components are fed within the component tubes from the right to left in FIGS. 1-3 and exits the tubes for picking at a picking position or location located at the forward end of the pallet 2.

The holding arrangement 2 is releasably mountable to the magazine 1 via a mechanical interface comprising, in this embodiment, a first or forward interface portion 10, 20 and a second or rearward interface portion 12, 22. The forward interface portion includes a lower interface element 10 provided in the magazine 1, and an upper interface element 20 provided in the holding arrangement 2. Similarly, the rear interface portion includes a lower interface element 12 provided in the magazine 1, and an upper interface element 22 provided in the holding arrangement 2. For providing easy handling of the pallet 2 and mounting thereof to the magazine 1, the pallet 2 is provided with forward and rearward handles 25, 26. In addition to providing easy handling or lifting of the pallet, the handles are also used for mounting of biased depression elements 29 for securing the component tubes 50 to the pallet 2, in the form of a plurality of spring biased holding fingers 29 applying a downward pressure onto the tubes 50 inserted under the holding fingers 29.

Furthermore, the vibratory feed magazine 1 comprises vibratory feeding means or movement generator 15, arranged for generating a reciprocating movement and for transferring this movement via an intermediate element 16 to the forward interface element 10. The reciprocating movement is often so fast and the length of stroke so short that it to a human observer may appear as a mere vibration, rather than an accurately controlled reciprocating movement, hence the term "vibratory feed". As movement generating device 15, use may be made of movement generators generally known within the art, such as solenoids, linear motors, belts or wires driven by rotating motors, rotation of a cam or a lead screw, etc. Therefore, the movement generator 15 will not be described in further detail.

Figure 4:
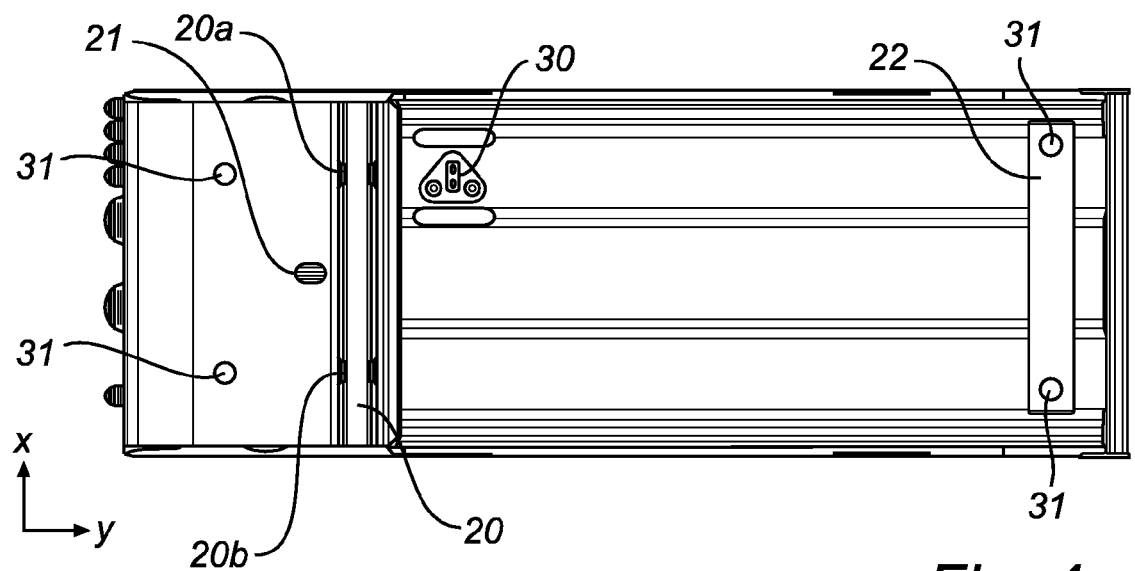
FIG. 4 is a bottom plan view of the holding arrangement of the FIG. 1 embodiment.
Figure 5:
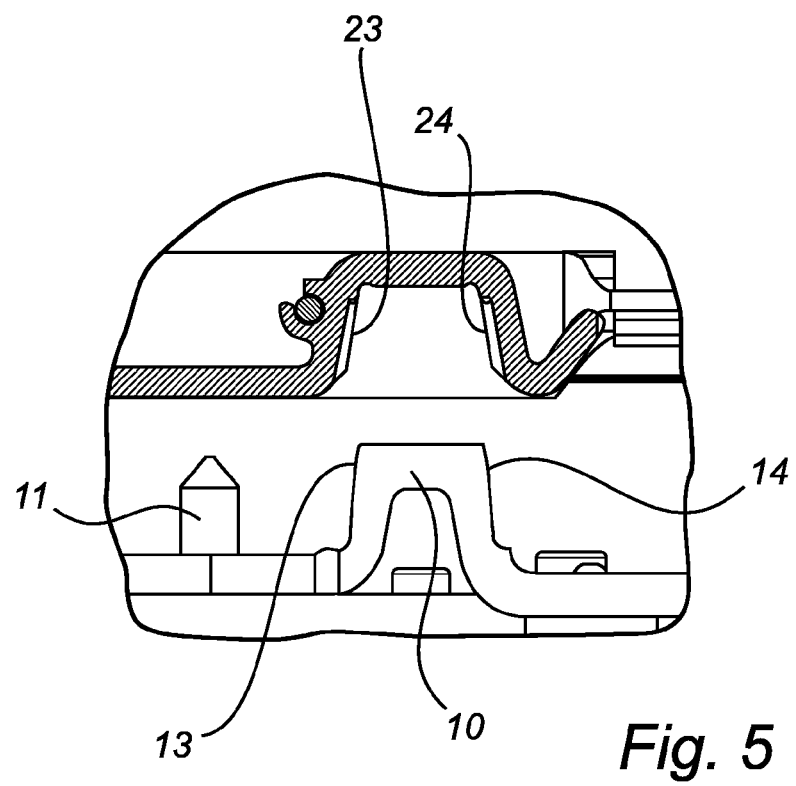
FIG. 5 is an enlarged partial sectional view illustrating the interface between the holding arrangement and magazine.

Turning specifically to FIGS. 4 and 5, the mechanical interface between the pallet 2 and the magazine 1 will be described. In this embodiment, the reciprocating movement is transferred from the magazine 1 to the pallet 2 via the forward interface portion 10, 20, while the rear interface portion 12, 22 merely provides a sliding engagement and secures proper alignment and orientation of the magazine 1 and pallet 2 in a vertical or Z direction. Even though all illustrated embodiments utilizes a forward engagement portion for transferring motion, describing preferred embodiments, it should be noted that the present invention is by no means limited to such a configuration. Alternatively, the movement transferring portion of the interface may be provided solely at the rear end of the pallet/magazine, or at both the rear and forward ends.

The forward interface portion comprises two laterally separated interface points, of which the interface points 20a, 20b of the pallet can be seen in FIG. 4. In the magazine 2, the interface element is in the form of a laterally extending bar 10, with a general cross-sectional shape of a frustum cone, but provided with cross-sectional curvatures at the upper portion thereof. These curvatures result in curved upper contact surface portions 13 and 14, which are aligned in the longitudinal direction of the magazine 1, i.e. in the movement or feeding direction of the magazine and pallet which is indicated in the figures as the Y direction. In the pallet, the interface element 20 comprises a laterally extending recess 20, with laterally separated, slightly protruding interface points 20a, 20b. In this embodiment, each interface point 20a, 20b has the cross-sectional shape of a frustum cone, and each interface point has essentially conical contact surface portions 23, 24.

It should be noted that even though in the illustrated example, the two upper contact surface portions 13 and 14 of the base element are both curved, embodiments of the invention are not limited to the illustrated example. In some embodiments, one of said two upper contact surface portions 13, 14 may be curved in cross-section, while the other contact surface is essentially straight in cross section. It should also be noted that even though, in this embodiment, curved contact surfaces 13, 14 are located in the base element and essentially straight contact portions 23, 24 are located in the interacting element, this configuration could be reversed. Furthermore, it is also contemplated that mating contact surface portions of both the base and interacting element, in at least one interface point, are presented with a curvature at the abutment between the two.

Upon mounting of the pallet 2 onto the magazine 1, the contact surface portions 23, 24 of the pallet are brought into contact with the corresponding curved contact surface portions 13, 14 of the magazine. Due to the curvature of the lower contact surfaces 13, 14, a contact without gaps and with freedom from play is obtained. Furthermore, the curvature renders the interface tolerant to wear of the contact surfaces. Furthermore, the conical configuration of the upper contact surfaces 23, 24 results in an easy mounting of the pallet 2 to the magazine 1. Preferably, the cone angle is in the range of 5° to 40°, more preferably between 10° and 30°, and even more preferably between 15° and 25°.

In this embodiment, the cone angle is about 20°. Thereby, the abutment between the curved contact surface 13, 14 of the magazine 2 and the corresponding opposing contact surface 23, 24 of the pallet is in a tangential plane at an angle of about 80° to the horizontal plane, which in the described embodiment corresponds to the plane of the feeding movement. Thereby, the reciprocating feeding movement may be transferred almost normal to the plane of the abutment, which will minimize disturbing forces generated by the movement. Furthermore, the cone angle will be sufficiently small to allow the pallet to rest on the magazine in a stable and secure manner, due to the gravitational force and weight of the pallet, while still being sufficiently large to avoid a wedging effect that will impede with the easy removal of the pallet from the magazine. Also, by providing the abutment point in a horizontal plane essentially corresponding to or being in vertical proximity of the horizontal plane of the centre of gravity, essentially no forces will arise to rotate or move the pallet in other directions than the intended reciprocating feeding direction.

Furthermore, the curved contact surface will render the interface independent of the angular orientation of the pallet 2 relative the magazine 1. In other words, even if a disturbance or tolerance fault of the rear interface portion 12, 22 would result in an elevated position of the pallet rear end 28, i.e. a forward tilt of the pallet 2, the curvature of the surface portions 13, 14 would still ensure a proper and secure interface between the pallet 2 and the magazine 1.

In the illustrated embodiment, the magazine 1 comprises a guide pin 11 for interaction with an engaging guide pin hole 21 of the pallet. Here, the guide pin interface 11, 21 is used for the lateral positioning of the pallet 2 relative the magazine 1, i.e. in the X direction as illustrated in the drawing. As understood by the skilled person, means may be provided in the forward interface portion, the rear interface portion, or both, for providing said lateral positioning. Thus, the guide pin 11 and co-operating guide pin hole 21 are optional. Furthermore, such a guide pin could in theory also be used for positioning the pallet in the longitudinal or Y direction. Then, the positioning or guiding by the pin in the longitudinal direction could be limited to guiding during assembly or mounting of the pallet 2 to the magazine 1 only. In operation of the movement or feeding process, the guide pin is only acting for positioning in the lateral direction. However, in the illustrated embodiment, a proper longitudinal positioning of the pallet is obtained by the forward interface portion 10, 20.

Figure 3:
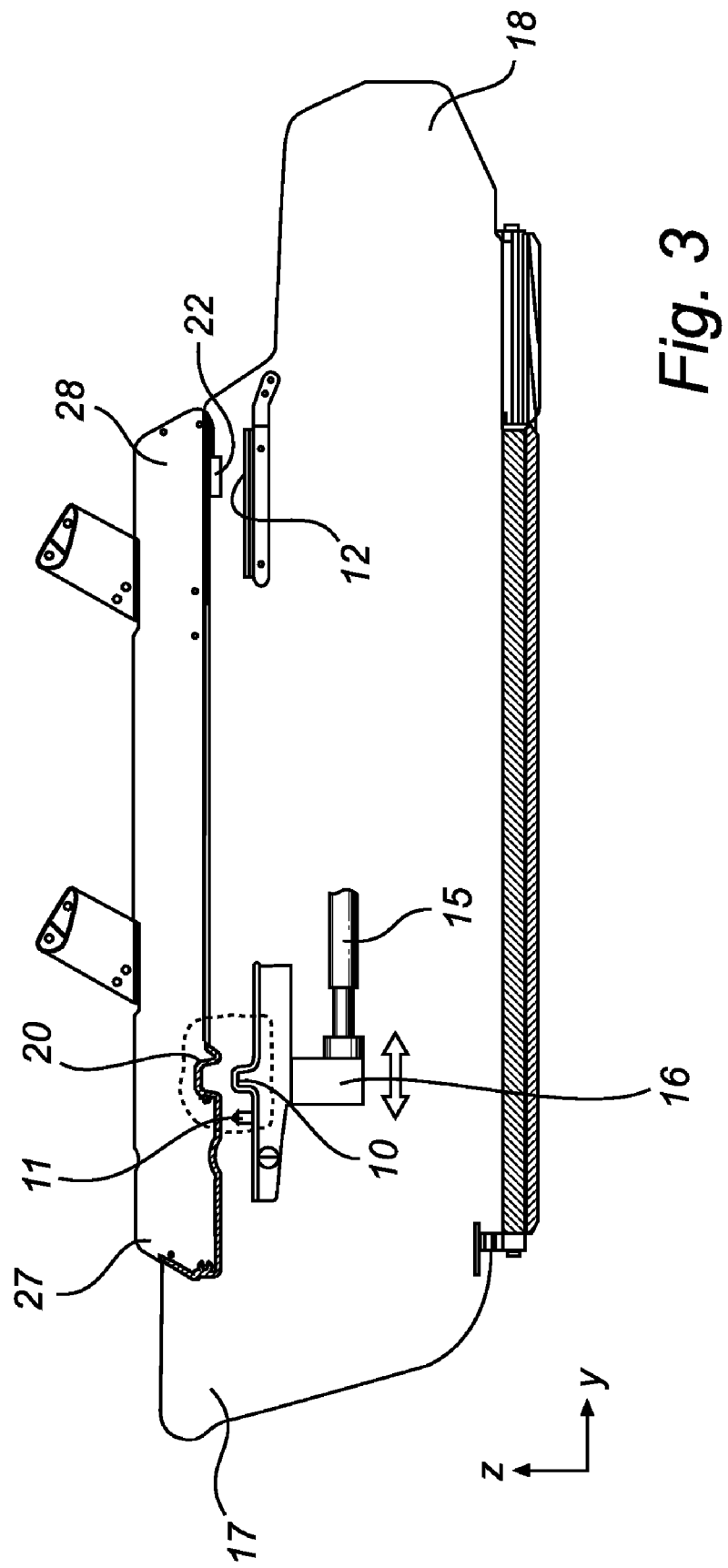
FIG. 3 is a sectional view of the FIG. 1 embodiment.

Furthermore, rear interface portion 12, 22 provides a sliding engagement between a sliding plate 12 of the magazine 1 and a corresponding sliding plate 22 of the pallet 2. In this embodiment, the magazine plate 12 is located at the lateral centre of the magazine and pallet, while the pallet plate 22 extends laterally to essentially the width of the pallet 2. Of course, this may also be reversed, resulting in a narrow, laterally centrally located pallet plate 22, and a laterally extended magazine plate 12. Preferably, at least one of the sliding plates 12, 22 are formed from a durable, low friction plastic material. Thus, vertical positioning of the pallet 2, i.e. in the Z-direction as indicated in FIG. 3, is obtained by the rear, laterally central interface portion 12, 22 and the front, laterally separated interface portions 10, 20a, 20b.

The pallet is further provided with laterally and longitudinally spaced protrusions 31 for supporting the pallet when placed on a flat surface away from the magazine 2, and an electronic identity chip 30 for interaction with a corresponding chip reader provided in the magazine.

Figure 6:
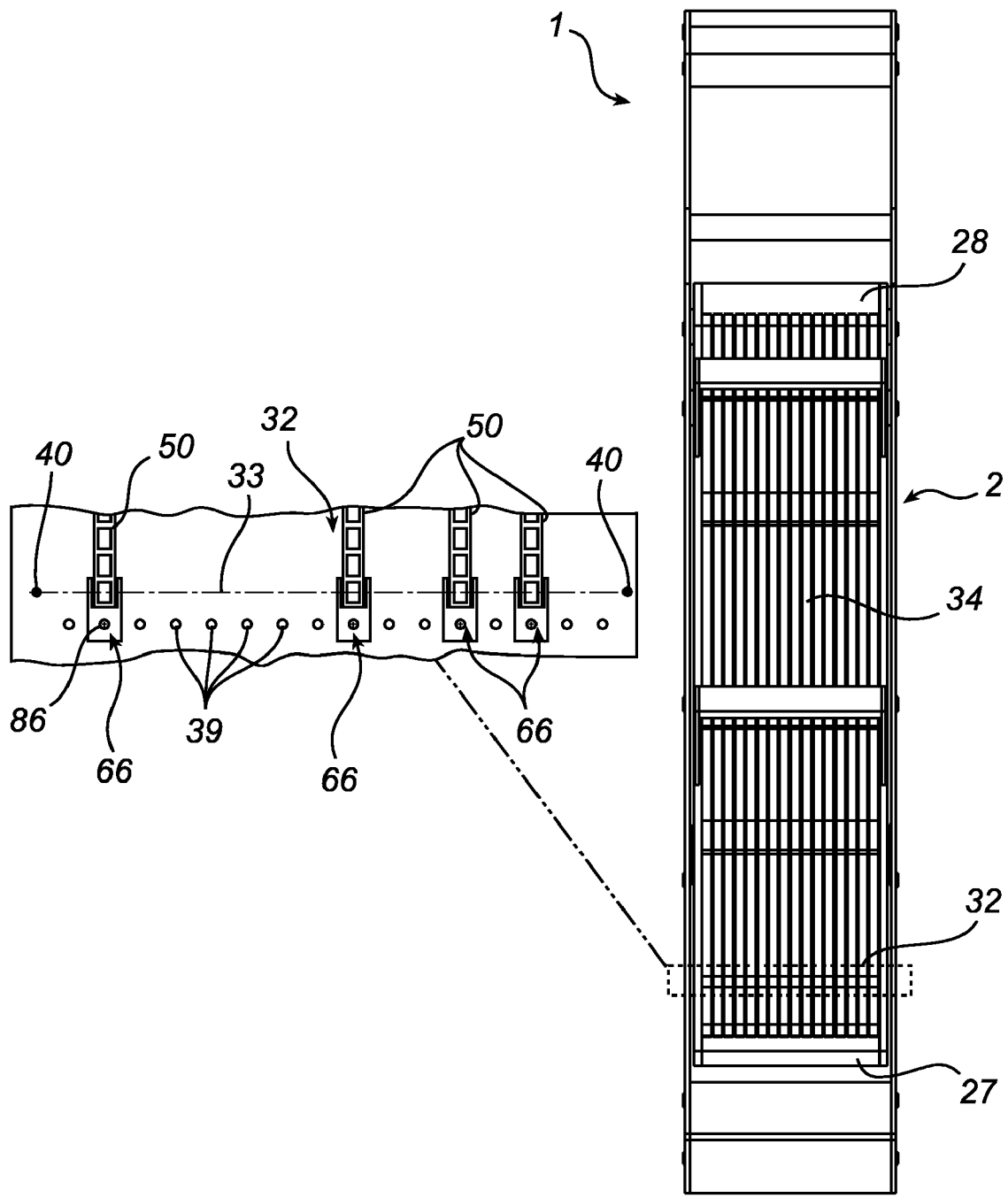
FIG. 6 is top plan view of an embodiment of a vibratory feed magazine and holding arrangement, including an enlarged partial view illustrating the picking positions.

Turning now to FIG. 6, there is schematically shown the magazine 1 provided with the pallet 2 according to the present exemplifying embodiment. In this figure, the forward and rear ends 27, 28 of the pallet 2 are indicated, for clarifying the direction of feeding the components. Thus, the components are fed within the component tubes, by virtue of the reciprocating feeding motion, from the proximal or rear end 28 of the pallet towards the distal or forward end 27 thereof, towards a portion of the pallet referred to as a reception portion 32. There, the distal end of the component tubes 50 are received by component positioners 60, 62, 64, 66, 160, 360, the components are advanced out of the component tubes, and the components are picked by a pick-up head at a picking position thereof.

The reception portion 32 is illustrated in the enlarged portions of FIG. 6 and shows fiducial marks 40 for calibrating the picking position, component tubes 50, component receivers or positioners 66, a virtual picking line 33 (dashed line), illustrating the picking positions of each component or component tube position, and threaded screws 86 for fixation of the positioners 66 by to corresponding threaded borings 39 provided in the pallet.

Thus, in the embodiment shown in FIG. 6, the component positioners having two protruding reception arms between which the tube 50 is introduced. Also, the component positioners 66 are releasably mounted to the pallet in fixed engagement at the reception portion 32 of the pallet by screws. However, as will be apparent from the following description, embodiments of the invention are also applicable to other types of component positioners, such as snap-in positioners, adjustable positioners, and component positioners fixedly formed or integrated in the pallet.

Figure 7:
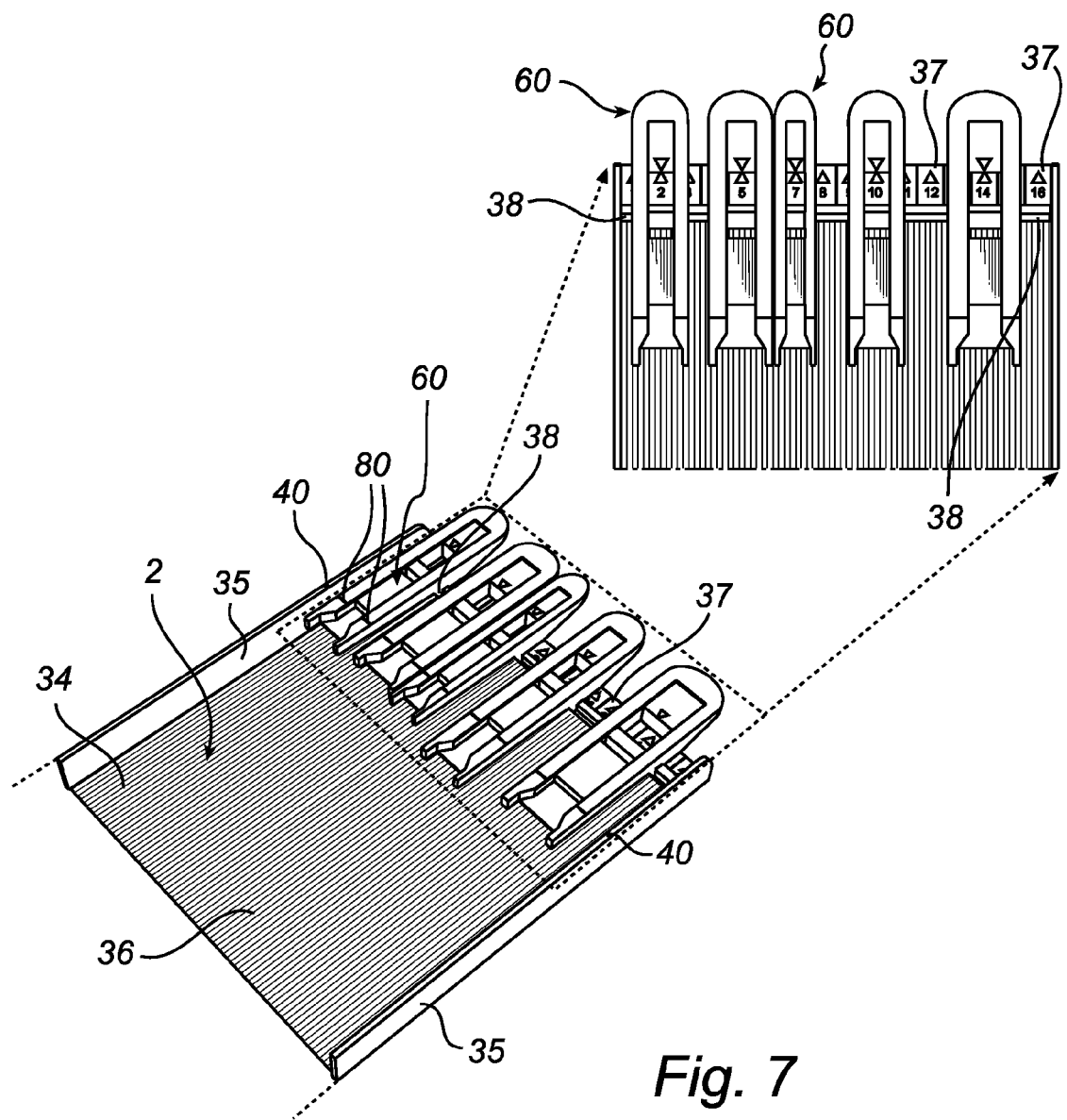
FIG. 7 is a cut-away perspective view and top plan view, respectively, illustrating a portion of an embodiment of a holding arrangement as shown in FIG. 1 provided with component positioners.
Figure 8:
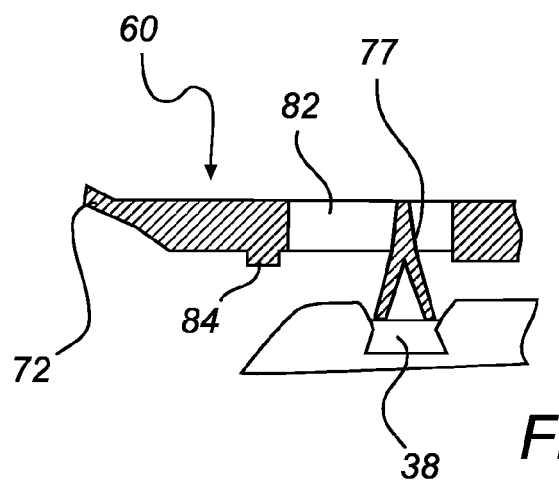
FIG. 8 is a partial sectional view illustrating an exemplary interface between a component positioner and a holding arrangement.

Turning now to FIGS. 7 and 8, component positioners 60 of a different embodiment is illustrated in mounted relationship with the front end 27 of the pallet 2, i.e. at the reception portion 32 thereof. Here, the component positioners are readily and releasably mountable to the pallet 2 in a snap-in arrangement, schematically illustrated in FIG. 8.

As illustrated, the pallet 2 is arranged for receiving and holding a plurality of component positioners 60, of different sizes and widths positioned side-by-side at the reception portion 32. The pallet 2 comprises a bottom plate or floor 34 and elongate side walls 35. A recess 38 extending along the lateral width of the bottom plate 34 is provided for achieving the snap-in relationship with a co-operating snap lock element 77, which comprises a pair of oppositely arranged flexible protrusions. Upon mounting of the component positioner 60 onto the pallet 2, the protrusions 77 are simply introduced into the recess 38 and the positioner is slightly pressed against the bottom plate 34. Removal of the positioner 60 is achieved by simply lifting the handle 72 provided at the distal end of the component positioner 60.

The pallet 2 is further provided numerical markings 37 indicating lateral positions for the component positioners 60. These markings indicate in this embodiment 16 lateral positions for mounting of 16 narrow component positioners. Since the pallet is arranged for receiving component positioners 60 of different widths, the number of possible positioners for a single pallet may vary. Nevertheless, the positions on the pallet may be predetermined, and the numbering on the pallet may function as a help to an operator in the placement of the positioner such that placement at the correct positions and of the correct number of positioners can be achieved.

As a further positioning aid, the component positioners 60 and the pallet markings 37 are provided with oppositely pointing arrows or triangles 37 and 83. The component positioner 60 is further provided with an aperture 82, extending vertically through the positioner 60, such that the number and triangle marking 37 of the pallet 2 may be viewed through the aperture 82 during and after mounting of the component positioner 60. Thus, by aligning the facing tips of the triangles in relation to each other, a proper positioning may be readily obtained, which reduces the possible time required for repositioning the component positioners 60. Even though the arrows and numbers would be used for indicating proper lateral positioning of the component positioners, it is sometimes desirable to place the component positioners at other lateral locations, e.g. when the lateral dimension of the positioners falls outside standard dimensions. Therefore, in the present embodiment, the pallet 2 is arranged for receiving and holding the component positioners at other, i.e. intermediate, lateral locations lying between the locations indicated by the arrows and numbers.

In an alternative embodiment, the positioners can only assume fixed lateral positions in the holding arrangement, essentially corresponding to those indicated by the numbers. Then, there would be no need for the guiding arrows 37. Such a solution could result in a facilitated positioning of the component positioners. On the other hand, such a solution would be less flexible as compared to the illustrated example, since it would no longer be possible to place component positioners in intermediate lateral locations between said fixed positions.

As an even further aid in positioning of the component positioners 60, the bottom plate 34 of the pallet 2 is provided with longitudinally extending grooves and ribs 36. The component positioners are provided with downwardly directed protrusions 84 arranged to engage into the grooves 36. Thereby, if a slight lateral misalignment arises when attempting to mount the component positioners 60, the engagements between the protrusions 84 and grooves 36 will guide the component positioners in the correct lateral positions. Furthermore, by providing the component positioners 60 with at least two longitudinally spaced apart protrusions 84, the engagement between such protrusions 84 and the grooves 36 may provide an angular alignment during mounting of the component positioners 60.

Also, the pallet 2 is provided with fiducial markings 40 indicating the picking positions for picking of the components, as mentioned above, and the component positioners 60 are provided with corresponding picking position lines 80. Thus, upon loading of a pallet 2 with component positioners 60, preferably away from the magazine 1 and the component mounting machine, and the component tubes 50, the picking position lines 80 and the fiducial markings 40 may be used for calibrating the picking positions for all components held by the pallet 2. Upon mounting of the pallet 2 onto the magazine 1 and, then, into the component mounting machine, only the positions of the fiducial markings 40 of the pallet 2 need to be accurately determined in order to determine the picking positions for all components fed by the magazine towards the picking positions. Furthermore, the picking position lines 80 can be used for facilitating positioning of adjustable component positioners, such as the component positioners 64 and 160, which will be described in further detail below.

Figure 9A:
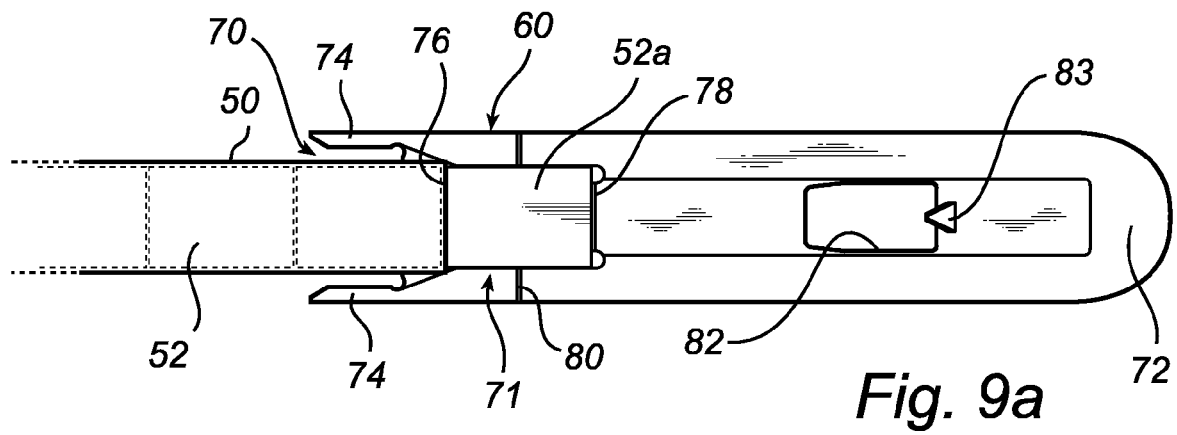
FIG. 9a and FIG. 9b is a top plan view and a perspective view, respectively, illustrating two examples of releasably mountable component positioners, as well as the interaction between an exemplary component positioner and a component tube.
Figure 9B:
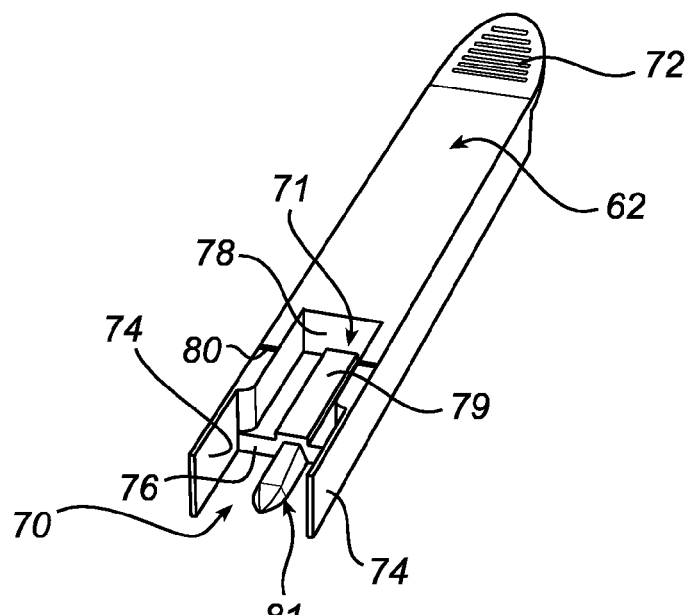
Figure 10:
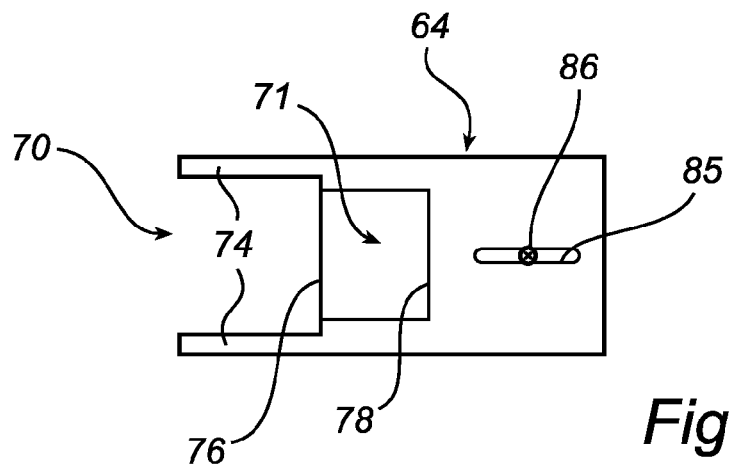
FIG. 10 is a top plan view of a further example of a component positioner.

In FIG. 9a, the embodiments of component positioners 60 of FIGS. 7 and 8 are shown in greater detail, while in FIGS. 9b and 10, further embodiments of component positioners 62 and 64 are shown. The positioner 60 comprises a component tube receiving portion 70 and a component receiving portion 71. The tube receiving portion 70 is laterally defined by protruding guide arms 74, which may be flexible or rigid depending on the specific embodiment. The component receiving portion 71 is defined by a bottom and side walls (not indicated by reference numerals) and a component stop 78. Thus, a component tube 50 is introduced into the component receiving portion 70 and advanced up to a tube stop 76. Upon applying a feeding motion to the pallet 2, components 52 are fed within the tube 50, advanced out of the open distal end of the tube 50 into the component receiving portion 71, slides onto a saddle portion 79 of the bottom wall, up to and in abutment against the component stop 78, which defines a picking position for the component 52a to be picked.

The exemplifying component positioner 62 shown in FIG. 9b differs from the other component positioners illustrated herein in that it comprises a protruding part or tongue 81 arranged for bringing a component tube 50 and the components held therein into proper position for interaction with the component positioner 64. The tongue 81 has an upper tongue surface and a tapered free end. The upper tongue surface is downwards sloping from the tube stop 76 towards the tapered free end, i.e. in the protruding direction. From the upper tongue surface, two sloping side tongue surface portions diverge downwards. In other words, the tongue 81 comprises two ramping portions, the tapered free end for laterally aligning an incoming tube and the sloped upper tongue surface for positioning a component tube 50 into an appropriate height position for administering a component at a suitable height towards and onto the saddle portion 79. Further details of component positioners according to this and other embodiments may be found in the co-assigned International Patent Application No. PCT/SE2008/050351.

Turning to FIG. 10, there is shown an embodiment of a component positioner 64 having adjustable mounting capabilities. The positioner 64 is here provided with a longitudinally extending slit 85 and an adjustment screw 86, such that the position of the component stop 78 may be adjusted to the dimensions of the components to be picked. In other words, when long components are to be picked, the component positioner 64 may be adjusted towards the forward end 27 of the pallet 2, and when components having a shorter longitudinal extension are to be picked, the positioner 64 may be adjusted towards the rear end 28 of the pallet 2.

Figure 11:
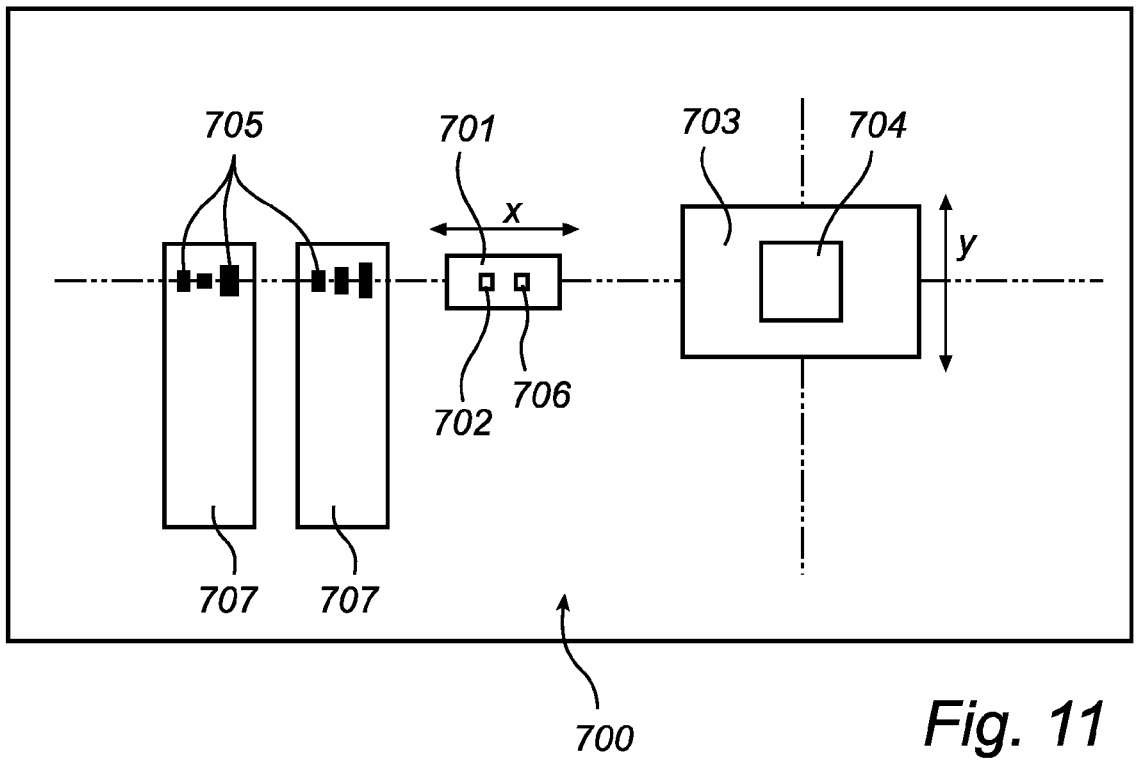
FIGS. 11 and 12 are schematical drawings illustrating the movements of a working head and a mounting substrate in component mounting machines of split-axis and gantry type, respectively.
Figure 12:
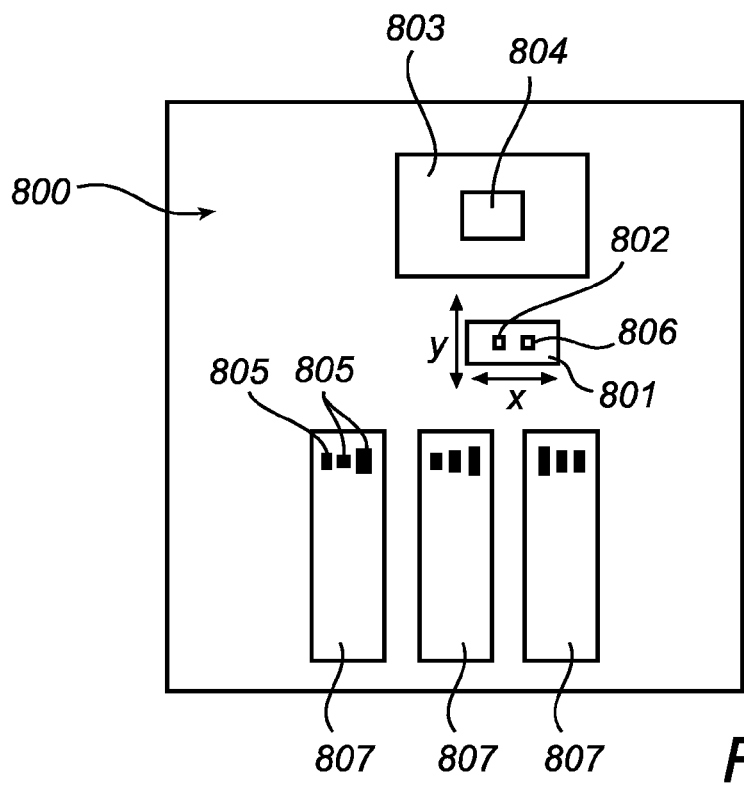

In FIGS. 11 and 12, two typical working principles of component mounting machines are schematically illustrated. It should be noted that the present invention is readily applicable to both of these types of component mounting machines, as well as to any other types of mounting machines involving vibratory feeding of components towards a picking position for subsequent picking by a picking head.

In FIG. 11, a component mounting machine 700 of the split-axis type is shown. The machine comprises an X wagon 701, which is movable along an X axis, and a Y wagon 703, which is movable along a Y axis essentially perpendicular to the X axis. The X wagon 701 generally carries a component picking head 706, as well as vision means 702, such as a camera. The wagons and their associated parts are per se well known and therefore not described in further detail. The Y wagon 703 carries a substrate 704, such as for example a PCB (Printed Circuit Board), onto which the components 705 provided by the component magazines 707 are to be mounted. Thus, in order for a component to be properly placed at a correct position on the substrate, the X wagon and Y wagon are basically simultaneously moved such that the picking head is positioned directly above the mounting position.

In FIG. 12, a component mounting machine 800 of the other of the two most common component mounting machine types is shown, generally referred to as the gantry type. Here, a substrate 804 is positioned on a conveyer wagon 803 which provides transportation of the substrate through the mounting machine generally, but not exclusively, along an X axis. However, during the entire mounting procedure, i.e. picking and placing of all components 805 from magazines 807 intended for mounting by the particular machine, the substrate 804 is retained in a fixed position. Thus, the picking head 806 is positioned on a wagon 801 that is moved both in the X and Y directions. Generally, the wagon 801 is a Y wagon movable along the Y axis and suspended in a gantry, which gantry in turn is movable along the X axis. Again, the wagon 801 holding the picking head 806 generally also comprises a camera or other vision means 802 for, inter alia, locating one or more fiducial markings and other points of reference.

Figure 13:
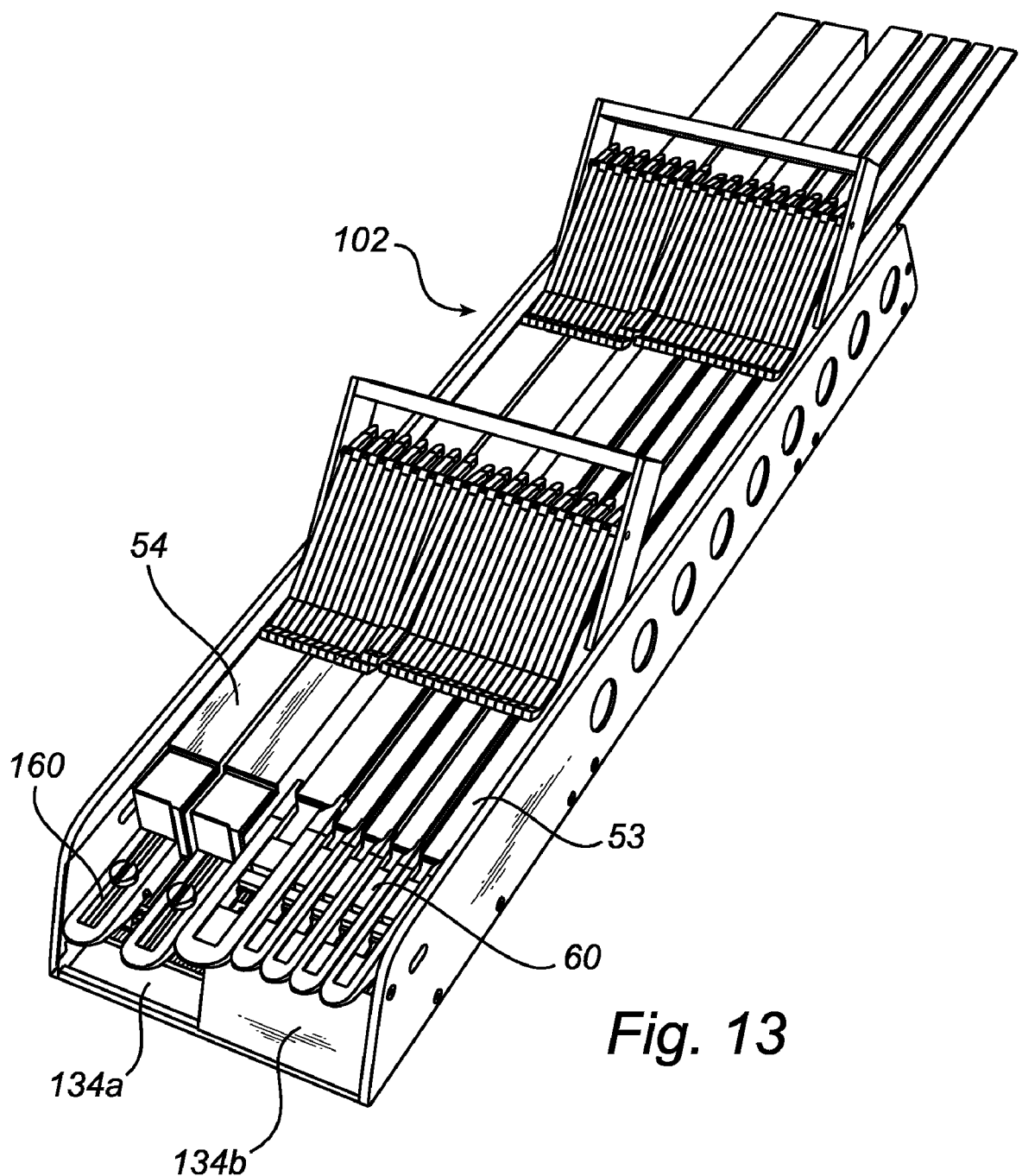
FIG. 13 is a perspective view and FIG. 14 is a sectional plan view of a holding arrangement according to a further embodiment.
Figure 14:
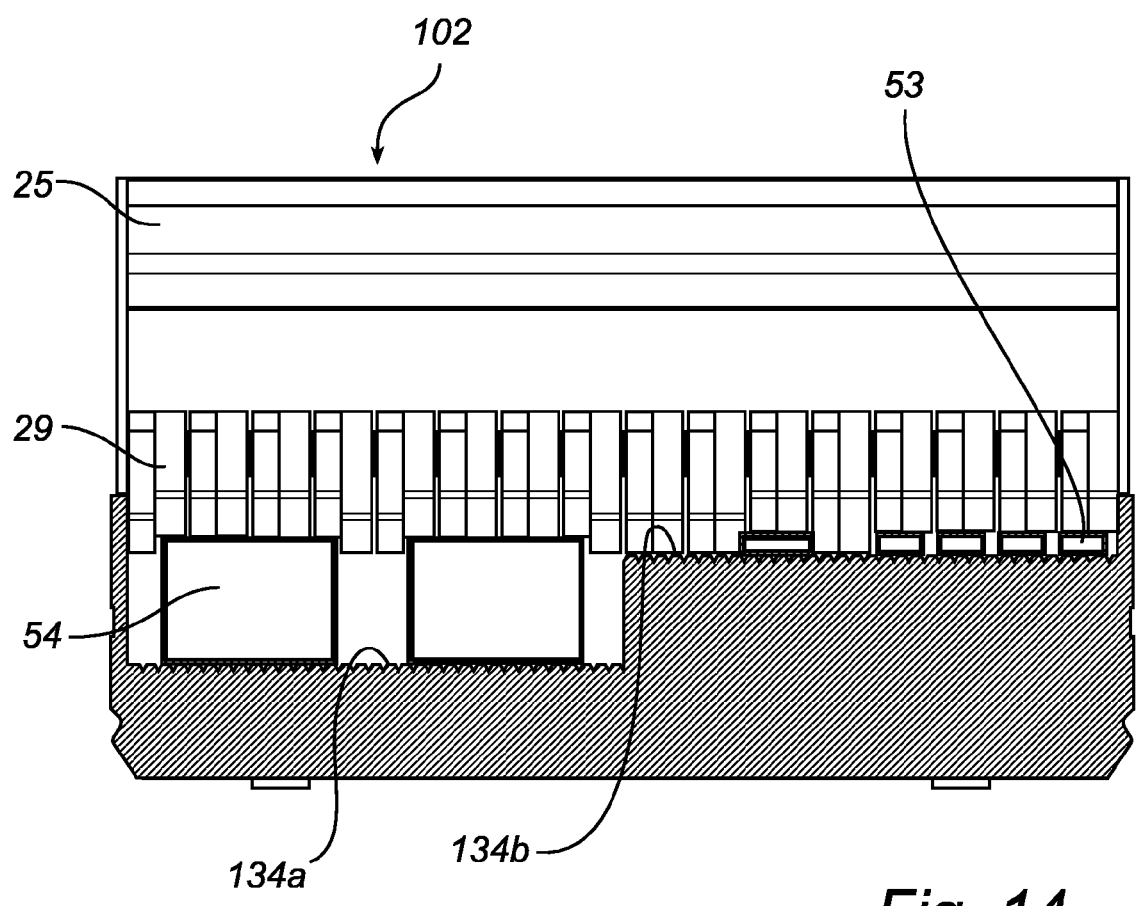

With reference now to the perspective view and sectional view FIGS. 13 and 14, respectively, a further embodiment of a holding arrangement or pallet 102 will be described. In this embodiment, the pallet 102 comprises bottom plate portions 134a and 134b which are located at different heights. This is in order to accommodate both low component tubes 53 and high component tubes 54 in a single pallet. Thereby, the difference in the height or Z position of the upper surfaces of differently sized components held by the component tubes 53, 54 may be significantly reduced. This reduces picking and placing time since the picking head have to travel a smaller distance in the Z direction for a average picking as compared to a situation where the picking Z position would vary greatly. As can be seen in the figure, differently configured or sized component tubes 53, 54 calls for differently configured component positioners 60, 160. For ease of description, the cross-sectional shape of the component tubes has been greatly simplified and is only schematically depicted in FIGS. 13 and 14.

In the illustrated example, the component positioners 160 are of the adjustable type, with adjustability functionality similar to that described above in relation to the adjustable component positioner 64. However, in this example the component positioner 160 lacks a component receiving portion 71, and the tube receiving portion 70 is limited to an essentially vertical proximal end wall acting as a component tube stop, as well as a component stop. Thus, upon loading of the component tubes 54, each tube 54 is advanced up to the proximal end wall of the component positioner 160. Prior to loading, the tube has been modified by removing the top wall at of the tube 54, at a distal end thereof. The removed portion of the top tube wall, or tube roof, extends a distance corresponding to slightly greater than the length of a component. The distance that the interior of the tube is exposed must be sufficient for entirely exposing a component to be picked by a picking head without the remainder of the tube top wall interfering with the picking process, while at the same time keeping the subsequent components securely contained within the tube housing. During the component mounting process, components are fed by the reciprocating motion up to the proximal end wall of the component positioner 160, and are there picked by a picking head.

Figures 15A, 15B:
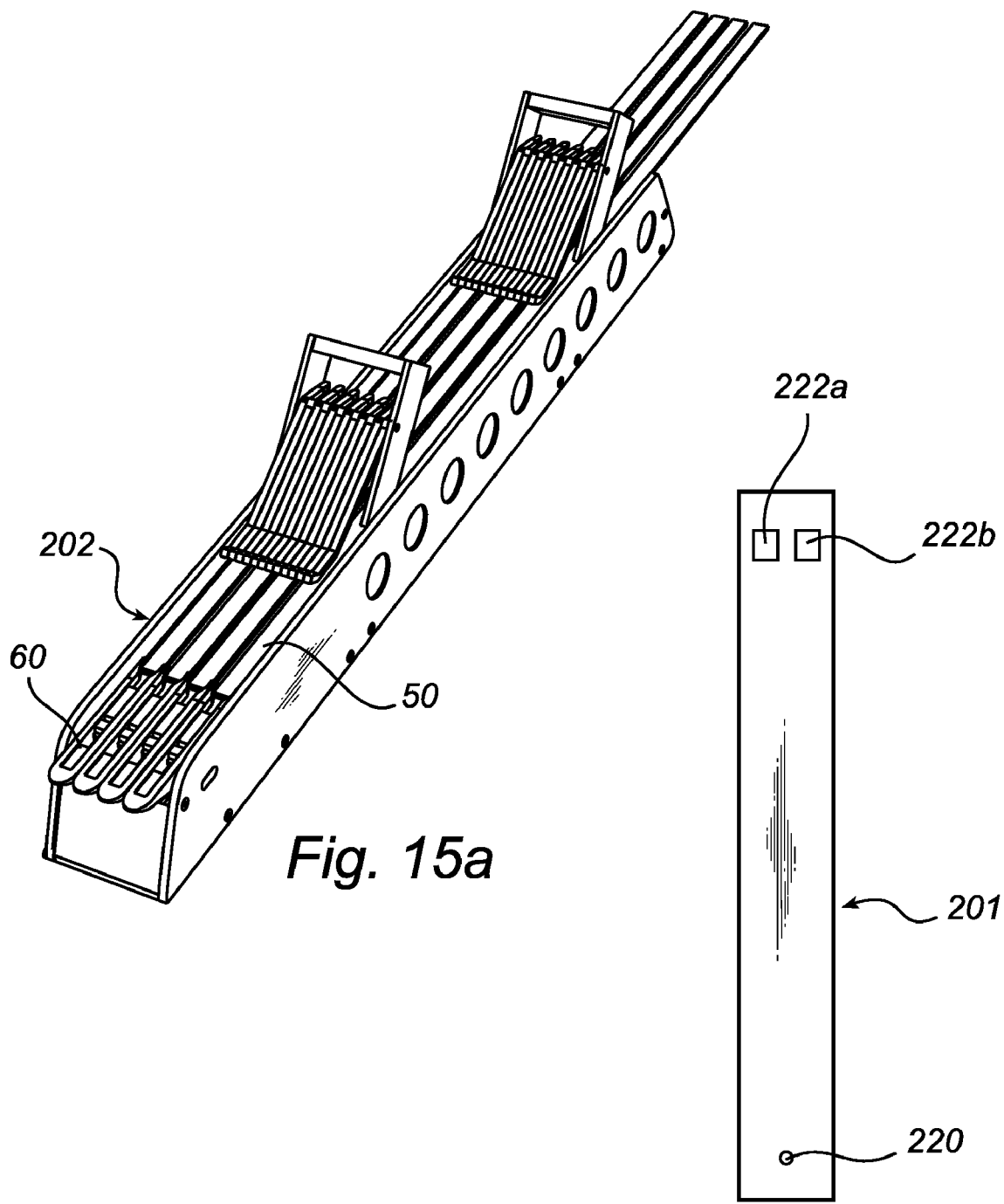
FIGS. 15a and 15b are perspective and schematical bottom plan views of a holding arrangement according to another embodiment.

Turning now to FIGS. 15a and 15b, a further embodiment of a pallet 202 is illustrated in a perspective view and of a magazine 201 in a highly schematical top plan view. Here, the pallet 202 has a slender configuration and is arranged for hold a smaller number of component positioners 60 and component tubes 50. The general function and features of the pallet 202 is the same as described above, e.g. in relation to FIGS. 1-8. However, the interface elements are in this embodiment of a different configuration. First, the lower forward interface portion 220 is in the form of a guide pin having a curved contact surface area at least in the direction of reciprocating movement, i.e. in a forward and/or rearward surface thereof. Preferably, the guide pin is rotational symmetrical, but other configurations may also be appropriate, such an elliptical configuration in a horizontal cross-section.

The upper part of the forward interface portion, i.e. in the pallet 202, is preferably a recess having horizontal cross-section corresponding to the guide pin 220. Thus, the recess has preferably a conical shape with a cone angle in the range of 5° to 40°, more preferably between 10° and 30°, and even more preferably between 15° and 25°. In this embodiment, two rear interface portions 222a, 222b are laterally spaced apart and provide a sliding engagement with corresponding interface portions provided in the pallet 202, preferably a sliding plate.

Furthermore, the rear interface portions may also be provided with a lateral guiding element restricting the lateral movement of the rear end of the pallet 202. Thereby, any rotating effect on the pallet due to an offset centre of gravity or an offset reciprocal movement will be efficiently reduced or eliminated. As understood by the skilled person, the more slender configuration of the pallet 202 may be used for providing a more slender magazine, or, more appropriately, for providing a magazine arranged to hold a plurality of pallets 202. Then, the interface portions schematically illustrated in FIG. 15b are suitably multiplied.

Figure 16A:
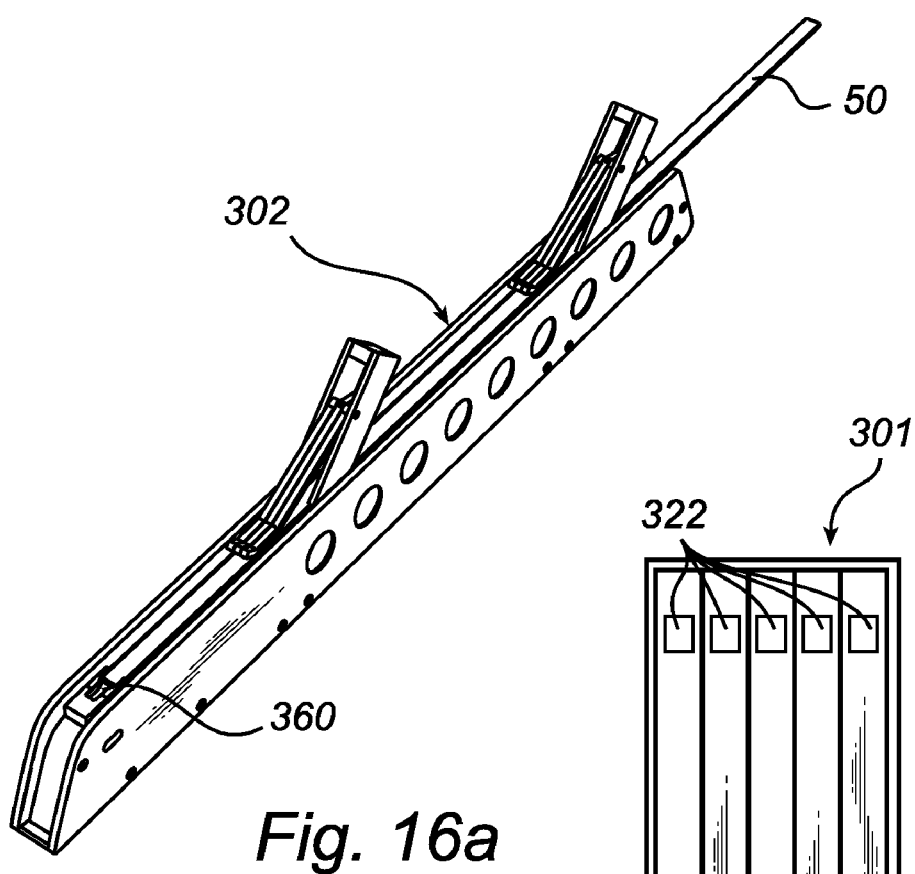
FIGS. 16a and 16b are perspective and schematical bottom plan views of a holding arrangement according to yet another embodiment.
Figure 16B:
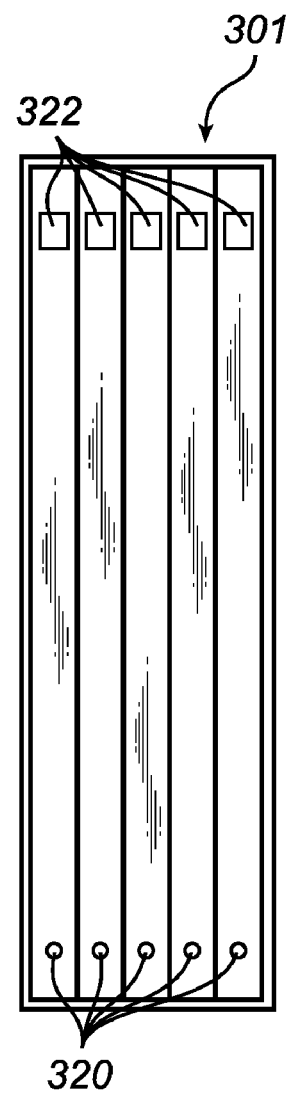

Turning finally to FIGS. 16a and 16b, a still further embodiment of a holding arrangement 302 is presented, as well as a corresponding vibratory feed magazine 301, which is very schematically depicted. According to this embodiment, the arrangement 302 is arranged for holding a single component tube 50. Furthermore, the arrangement 302 is provided with a single component positioner 360, which in this embodiment is integrally fixed to the arrangement. However, alternatives with releasably mountable component positioners, similar to the component positioners described above, are also contemplated for the single-tube holding arrangement 302. As understood by the skilled person, a plurality of single-tube holding arrangements 302 may be suitably arranged side-by-side in a magazine 301.

In FIG. 16b, the interface portions of a magazine 301 according to this embodiment is roughly depicted. As a forward interface portion, which is arranged for transferring the reciprocating movement between the vibratory feed magazine 301 and the holding arrangement 302, use is made of a similar curved guide pin 320 and conical recess configuration as described above in relation to FIG. 15b. Furthermore, the rear interface portion is again in the form providing a sliding engagement between the rear ends of the holding arrangement and magazine, respectively. Since the single-tube holding arrangement 302 is in this embodiment of very small width, and since a component tube 50 will essentially be positioned along the lateral centre axis of the holding arrangement, the risk of an offset centre of gravity affecting the stability of the holding arrangement during reciprocal movement thereof is greatly reduced. Therefore, in this embodiment, a single rear interface element is provided at the holding arrangement and the magazine, respectively, which also in this embodiment is in the form providing a sliding engagement between the upper and lower interface elements.

The invention has been described above with reference to a few embodiments. However, as is readily appreciated by a person skilled in the art, other embodiments than the ones disclosed above are also contemplated within the scope of the present invention. For instance, the interface elements having curved contact surfaces and described to be positioned in the lower interface elements may interchangeably be provided in the upper interface portions, i.e. in the pallet or holding arrangements. Also, the front and rear positioning of the described configurations of the front and rear interface elements are generally interchangeable. Furthermore, the different embodiments of component positioners may be provided for any of the disclosed pallet or holding arrangement embodiments.

The invention claimed is:

1. A component tube holding arrangement for holding one or more elongated component tubes, and for vibratory feeding of components in a feeding direction towards a picking position in a component mounting machine, said component tube(s) containing consecutively stored components and being provided with an open end, respectively, for releasing components from the component tube(s) at the picking position, comprising:

a support surface for supporting the component tube(s), a reception portion for receiving said open end of the component tube(s), and at least one component stop at the reception portion defining a picking position for components fed from said open end;

characterized in that the arrangement is arranged to be releasably mountable in the component mounting machine or in a vibratory feed magazine arranged to be loaded into the component mounting machine, and wherein the arrangement lacks component feeding means and is arranged for allowing vibratory feeding means provided in the magazine or in the component mounting machine to engage with the arrangement for feeding the components towards the picking position; and the arrangement comprises first identification means holding information of the identity of the arrangement, and being arranged for operative connection to identity receiving means in said component mounting machine or in said magazine.

2. The arrangement as claimed in claim 1, wherein the first identification means is an electronic circuit operatively connectable to said identity receiving means.

3. A system for vibratory feeding of components towards a picking position in a component mounting machine, the components being consecutively stored in elongated component tubes provided with an open end, respectively, for releasing components from the component tube at the picking position, comprising:
- a plurality of component tube holding arrangements as claimed in any one of the preceding claims; and
- a vibratory feed magazine comprising vibratory feeding means for providing a vibratory feeding movement, and identity receiving means arranged for operative connection with said first identification means of said arrangements to receive information of the identity of each arrangement, the magazine being arranged to be loaded into the component mounting machine;
wherein each of said arrangements is arranged to be releasably mountable in the vibratory magazine, and is arranged for allowing said vibratory feeding means to engage with the mounted arrangement for affecting a vibratory feeding movement of the mounted arrangement for feeding the components towards the picking position.

4. The arrangement as claimed in claim 2, wherein the arrangement comprises second identification means holding information regarding the identity of the arrangement, and being arranged for reading by an external information reading device.

5. The arrangement as claimed in claim 2, further comprising one or more component positioners arranged to be mountable at said reception portion for receiving components fed from the component tubes, each component positioner providing a component stop defining said picking position.

6. The arrangement as claimed in claim 1, wherein the arrangement comprises second identification means holding information regarding the identity of the arrangement, and being arranged for reading by an external information reading device.

7. The arrangement as claimed in claim 6, wherein said second identification means is a bar code and said external information reading device is a bar code reader.

8. The arrangement as claimed in claim 6, further comprising one or more component positioners arranged to be mountable at said reception portion for receiving components fed from the component tubes, each component positioner providing a component stop defining said picking position.

9. The arrangement as claimed in claim 1, further comprising one or more component positioners arranged to be mountable at said reception portion for receiving components fed from the component tubes, each component positioner providing a component stop defining said picking position.

10. The arrangement as claimed in claim 9, wherein at least one of said component positioners is/are releasably mountable at the reception portion, preferably by means of a snap-in engagement, respectively.

11. The arrangement as claimed in claim 10, wherein the reception portion comprises at least one recess for snap-in engagement with protrusion(s) provided on the positioner(s).

12. The arrangement as claimed in claim 11, wherein said at least one recess includes a plurality of recesses provided laterally side-by-side, each recess being arranged for receiving the protrusion(s) of a single positioner in snap-in engagement.

13. The arrangement as claimed in claim 11, wherein said at least one recess comprises a laterally extended recess adapted for receiving protrusions of a plurality of positioners side-by-side in snap-in engagement, such that the lateral position of the positioner may be continuously laterally adjustable.

14. The arrangement as claimed in claim 13, wherein said reception portion comprises a plurality of laterally adjacent indents for engagement with said positioners and guiding the lateral position of said positioners.

15. The arrangement as claimed in claim 14, wherein said indents are arranged in pairs of two longitudinally spaced indents for engagement with a positioner, such that the positioner may be guided into longitudinal alignment with the feeding direction during mounting thereof at the reception portion.

16. The arrangement as claimed in claim 9, wherein said one or more component positioners include a plurality of positioners, and wherein at least some of said plurality of positioners have different lateral extensions in adaptation to sizes of the fed components.

17. The arrangement as claimed in claim 1, wherein the arrangement is arranged to accommodate a plurality of said component tubes side-by-side in the lateral extension of the arrangement, and wherein all component tubes are supported by said support surface at the same level.

18. The arrangement as claimed in claim 1, wherein the arrangement is arranged to accommodate a plurality of said component tubes side-by-side in the lateral extension of the arrangement, and wherein said support surface is divided laterally into at least two portions having different support surface levels for accommodating component tubes of different heights.

19. The arrangement as claimed in claim 1, wherein the arrangement is arranged for holding a single component tube.

20. The system as claimed in claim 3, wherein said feeding means is arranged to provide a reciprocating movement of the mounted arrangement along the feeding direction of the components.

* * * * *